United States Patent [19]

Hayashi et al.

[11] Patent Number: 5,012,238

[45] Date of Patent: Apr. 30, 1991

[54] ABSOLUTE ENCODER

[75] Inventors: Yoshinori Hayashi; Kenzaburou Iijima, both of Shizuoka, Japan

[73] Assignee: Yamaha Corporation, Japan

[21] Appl. No.: 402,218

[22] Filed: Sep. 1, 1989

[30] Foreign Application Priority Data

Sep. 2, 1988 [JP] Japan ................. 63-220035

[51] Int. Cl.$^5$ ............................................ H03M 1/22
[52] U.S. Cl. ....................................... 341/15; 341/11; 341/16; 341/17; 341/116; 341/149; 341/150; 341/171; 341/172
[58] Field of Search ................. 341/15, 149, 150, 171, 341/172, 11, 16, 17, 116

[56] References Cited

U.S. PATENT DOCUMENTS 4,782,329 11/1988 Iijima et al. ................... 341/15

FOREIGN PATENT DOCUMENTS 577554 10/1977 U.S.S.R. ............................... 341/116

Primary Examiner—Mark J. Reinhart
Assistant Examiner—Nancy Le
Attorney, Agent, or Firm—Ostrolenk, Faber, Gerb & Soffen

[57] ABSTRACT

An absolute encoder for detecting the absolute (as opposed to the relative) rotational displacement of an encoder shaft includes a pair of pitch signals recorded on tracks and an associated signal processing circuit. The pair of pitch signals have different periods (wave lengths) which are such that they have no common factors. The signal processing circuit includes magnetic sensors for producing absolute position data indicative of the degree of displacement of the encoder shaft, on the basis of the pitch signals. Through the use of a pair of pitch signals having periods with no common factor, a high degree of resolution is obtained, without having no significantly increase the number of pitch signal tracks.

5 Claims, 2 Drawing Sheets

ABSOLUTE ENCODER

BACKGROUND OF THE INVENTION

The present invention relates to an absolute encoder, and more particularly relates to an encoder capable of detecting the absolute displacement of a mobile body from a reference position.

An incremental rotary encoder is one type of conventional encoder. Such an incremental rotary encoder includes a pitch signal track, a pair of magnetic sensors, a divider circuit connected to the magnetic sensors and a pole calculator circuit connected to the magnetic sensors in parallel to the divider circuit.

The pitch signal track is formed along a prescribed circular path on a magnetic recording medium, which is notatably in association with a rotary body. Magnetic information in the form of a series of continuous sine waves of a constant wave length $\lambda$ is stored on the pitch signal track. Each of the magnetic sensors is in the form of a magnetic resistor element formed on a glass substrate. The magnetic resistor element changes its inherent resistance in response to the intensity of the magnetic field in which it is located. This change in resistance is utilized for reading of the sine wave magnetic information stored in the pitch signal track. Facing the pitch signal track, the pair of magnetic sensors are spaced apart from each other by a distance equal to $(k \pm \frac{1}{4})\lambda$, k being an integer. The pitch signal track is movable in one longitudinal direction with respect to the magnetic sensors. The magnetic resistor element of each magnetic sensor changes its resistance depending on the intensity of magnetic field applied by the pitch signal track to produce a signal having a level corresponding to the relationship in position between the pitch signal track and the magnetic sensors. When one period of the sine wave magnetic information on the pitch signal track $\theta$ is in a range from 0 to $2\pi$, the magnetic sensors produce level signals $\sin \theta$ (A phase) and $\cos \theta$ (B phase), respectively. As the pitch signal track moves with respect to the magnetic sensors, the magnetic sensors produce a pair of detection signals $\sin \theta$ and $\cos \theta$ with a phase difference of $\pi/2$.

A divider circuit is also provided which includes A/D converters connected to the magnetic sensors and an angle calculator connected to the A/D converters. The A phase detection signal $\sin \theta$ is converted by one A/D converter to produce digital data Da whereas the B phase detection signal $\cos \theta$ is converted by the other A/D converter to produce digital data Db. At the angle calculator, an angle data $\theta$ is calculated from the two data Da and Db. This angle data $\theta$ indicates the position of either of the magnetic sensors within one magnetic domain on the pitch signal track.

There is also provided a pole calculator circuit which includes three wave shaping circuits and a direction discriminator circuit. Two of the wave shaping circuits are connected to the magnetic sensors for wave shaping of the A phase and B phase detection signals. The first and second output signals of these wave shaping circuits take the form of square waves which are phased from each other by $\pi/2$. When the magnetic recording medium rotates in the positive direction the first output signal precedes whereas, when the magnetic recording medium rotates in the negative direction, the second output signal precedes. The direction discriminator circuit determines the direction of the rotation depending on, for example, the level of the second output signal at rising of the first output signal. The output signal of the direction discriminator circuit is supplied to the up-down shift terminal of a counter. In accordance with the counting mode defined by the output signal from the direction discriminator cirucit, the counter counts the first output signal from the first wave shaping circuit. In one example, the counter operates in the up-count mode when the magnetic recording medium rotates in the positive direction. A zero point sensor is arranged facing the pitch signal track so that it should issue a zero point signal at every passage of the zero point on the pitch signal track. This zero point signal is converted into a zero point pulse after passage through the third wave shaping circuit of the pole calculator circuit. The zero point pulse is then passed to the reset terminal of the above-described counter. As a result, the counter is reset every time the zero point sensor passes by the zero point on the pitch signal track. Consequently, the count value N of the counter corresponds to the number of the magnetic domains on the pitch signal track passed by the magnetic sensors within a region between the current positions of the magnetic sensors and the zero point position. A combination of this count value N with the angle of data $\theta$ put out by the angle calculator is issued as an absolute position data Dout.

Having the above-described construction, the incremental rotary encoder suffers from several drawbacks. Even when the zero point on the pitch signal track arrives at the positions of the magnetic sensors, the counter in the pole calculator circuit cannot be initialized until the zero point signal is detected. As a result, the absolute position data Dout is inaccurate during this period. Data stored in the counter is destroyed when supply of power is accidentally interrupted. In order to avoid such undesirable data loss, a backup power supply has to be reserved.

An optical, absolute rotary encoder is another type of conventional encoder used for detecting an absolute displacement. This type of encoder includes, as an inforamtion recording medium, a circular disc secured to a center shaft which is mechanically coupled to a rotary body for synchronized rotation. A plurality of annular tracks are concentrically defined on this circular disc for storage of an angle information which indicates a rotation angle of the circular disc from a given reference position. For example, four sets of annular tracks are defined so that the first to fourth tracks should correspond to the first to fourth bits of the angle information. Each annular track is provided with several arcuate slits spaced from each other so that each open section should indicate a bit value "1" and each blind section should indicate a bit value "0". Utilizing the angle information given by the four sets of annular tracks, rotation of the circular disc from the reference position is detected at an accuracy of 22.5°.

A light source is arranged facing the plane of the circular disc in order to emit light beams towards the annular tracks on the disc. Each light beam passes through the disc only when it is emitted toward the open sections, i.e. the slits, in each annular track. Four sets of photodiodes are arranged on the side of the circular disc opposite to the light source in order to receive light beams which traveled via the open sections in the disc. The anode of each photodiode is grounded whereas the cathode is connected to a given power source via a resistor. The number of the photodiodes depends on the number of the annular tracks on the circular disc. The cathode of each photodiode is also connected to one input terminal (inverting) of a comparator. The other input terminal (non-inverting) of the comparator is connected to the slider of a variable resistor. One end of this resistor is grounded whereas the other end of this resistor is connected to a given power source. By changing the position of the slide in each variable resistor, the non-inversion level, i.e. the discrimination level, of the associated comparator is adjusted.

As the rotary body rotates, the circular disc rotates also in synchronism. Each light beam emitted by the light source goes through the circular disc only when it is directed to any one of the open sections formed by the slits in the annular tracks. On receipt of such a light beam, a corresponding photodiode is rendered conductive and the electric potential of its cathode falls. When no light beam is received, a corresponding photodiode remains non-conductive and the electric potential of its cathode remains high. The electric potential of each cathode is discriminated by an associated comparator for issue of an angle data. The above described rotary encoder produces angle data representative of the rotation angle of its associated rotary body.

The above-described absolute rotary encoder also differs from several drawbacks. In order to enhance the degree of resolution, the absolute position data must be provided with a comparatively larger number of bits and such large number of the bits inevitably involves as corresponding increase in the number of necessary annular tracks and of the sensors, i.e. the photodiodes.

SUMMARY OF THE INVENTION

It is the basic object of the present invention to provide an absolute encoder which provides a high degree of resolution with a small number of tracks carrying magnetic information.

DESCRIPTION OF THE PREFERRED EMBODIMENTS

Figure 1:
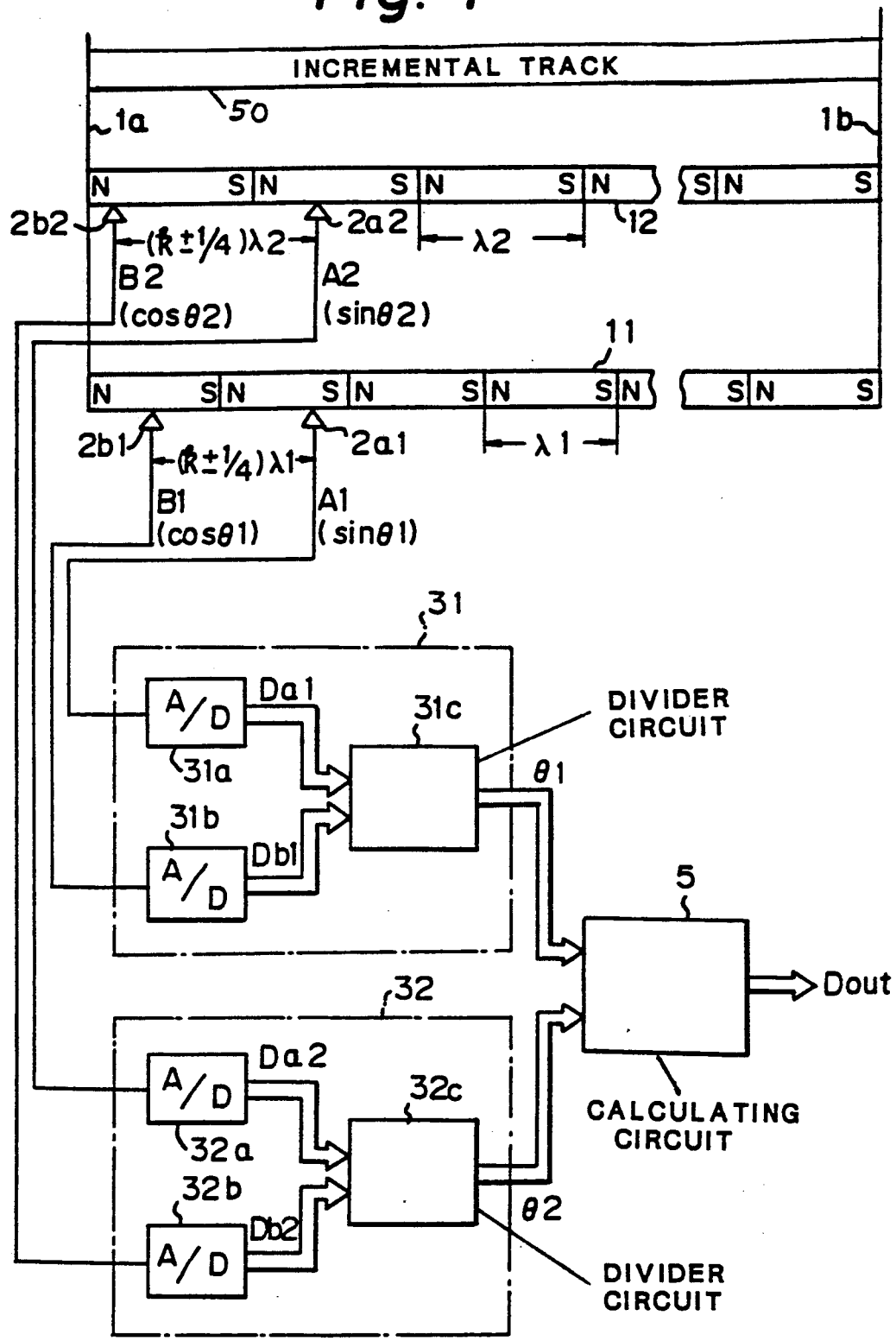
FIG. 1 is a block diagram of the first embodiment of the absolute encoder in accordance with the present invention.

One embodiment of the absolute encoder in accordance with the present invention is shown in FIG. 1 in which the encoder includes a pair of pitch signal tracks 11 and 12. The tracks are formed along two concentric annular paths chosen on a circular disc which rotates in synchronism with a rotary body (not shown). In FIG. 1, the section of each track 11 or 12 extends from a starting point 1a on a reference position to an end point 1b on the reference position.

In the first pitch signal track 11 is magnetically stored, a sine wave of wave length λ1 in the region from the starting position 1a to the end point 1B. The sine wave is repeated N1 times and the repetitive sine waves extend. Likewise, a sine wave pattern of wave length λ2 is stored, N2 times in the second pitch signal track 12, in the region from the starting point 1a to the end point 1b. Here the number of repetitions N1 and N2 of the sine waves are chosen so that they should have no common factors, i.e. comparing a group of prime factors constituting the repetition number N1 with a group of prime factors constituting the repetition number N2, any prime factor should not be common between the two groups. Examples are as follows $$(N1, N2) = (2,3); (3,4); (5,6); (6,7); \cdots ;(11,12); \cdots$$

Facing the first pitch signal track 11 are arranged a pair of first magnetic sensors 2a1 and 2b1 for detecting the magnetic information stored in the track 11. The magnetic sensors 2a1 and 2b1 are spaced from each other by a distance equal to $(k \pm \frac{1}{4})\lambda 1$. Likewise a pair of second magnetic sensors 2a2 and 2b2 are arranged facing the second pitch signal track 12, the sensors being spaced from each other by a distance equal to $(k \pm \frac{1}{4})\lambda 2$.

The magnetic sensors 2a1 and 2b1 issue level signals corresponding to their positions with respect to the first pitch signal track 11. More specifically, when the period ($\theta 1$) of the sine wave stored in the track 11 is in a range from 0 to $2\pi$, the magnetic sensor 2a1 issues a level signal sin $\theta 1$ and the magnetic sensor 2b1 issues a level signal cos $\theta 1$. As the pitch signal track 11 moves with respect to the magnetic sensors 2a1 and 2b1, the magnetic sensors issue a pair of detection signals sin $\theta 1$ (A1 phase) and cos $\theta 1$ (B1 phase) which are phased from each other by $\pi/2$.

The magnetic sensors 2a2 and 2b2 issue level signals corresponding to their positions with respect to the second pitch signal track 12. More specifically, when the period ($\theta 2$) of the sine wave magnetic information stored in the track 12 is in a range from 0 to $2\pi$, the magnetic sensor 2a2 issues a level signal sin $\theta 2$ and the magnetic sensor 2b 2 issues a level signal cos $\theta 2$. As the pitch signal track 12 moves with respect to the magnetic sensors 2a2 and 2b2, the magnetic sensors issues a pair of detection signals sin $\theta 2$ (A2 phase) and cos $\theta 2$ (B2 phase) which are phased from each other by $\pi/2$.

The first divider circuit 31 is connected to the first magnetic sensors 2a1 and 2b1, respectively. More specifically, the divider circuit 31 includes the first A/D converters 31a and 31b and an angle calculator 31c. The A/D converter 31a is connected to one magnetic sensor 2a1 whereas the other A/D converter 31b is connected to the other magnetic sensor 2b1. The detection signals sin $\theta 1$ of phase A1 and cos $\theta 1$ of phase B1 from the magnetic sensors 2a1 and 2b1 are converted into digital data Da1 and Db1 by the A/D converters 31a and 31b and, from these data, the angle calculator 31c produces an angle data $\theta 1$.

Likewise, the second divider circuit 32 is connected to the second magnetic sensors 2a2 and 2b2, respectively. More specifically, the divider circuit 32 includes the second A/D converters 32a and 32b and an angle calculator 32c. The A/D converter 32a is connected to the magnetic sensor 2a2 whereas the other A/D converter 32b is connected to the other magnetic sensor 2b2. The detection signals sin $\theta 2$ of phase A2 and cos $\theta 2$ of phase B2 from the magnetic sensors 2a2 and 2b2 are converted into digital data Da2 and Db2 by the A/D converters 32a and 32b and, from these data, the angle calculator 32c produces an angle data $\theta 2$.

A calculating circuit 5 in the form of an absolute position data producing means 5, in which an absolute position data converting table, made up of ROMs, is stored and is connected to the first and second divider circuits 31 and 32. On receipt of the angle data $\theta 1$ and $\theta 2$, the data producing means 5 produces an absolute position data Dout based on the paired angle data.

The above-described absolute encoder, shown in FIG. 1, operates as follows. As the magnetic recording medium (not shown) starts to rotate, the first magnetic sensors 2a1 and 2b1 produce detection signals of phase A1 and B1 whereas the second magnetic sensors 2a2 and 2b2 produce detection signals of phases A2 and B2, respectively. These detection signals are converted into digital data Da1, Db1, Da2 and Db2 by the A/D converters 31a, 31b, 32a and 32b. The digital data Da1 and Db1 are converted into an angle data $\theta 1$ by the angle calculator 31c whereas the digital data Da2 and Db2 are converted into an angle data $\theta 2$ by operation of the angle calculator 32c. Here, the angle data $\theta 1$ indicates the position of the magnetic sensor 2a1 in one magnetic domain of the first pitch signal track 11 whereas the angle data $\theta 2$ indicates the position of the magnetic sensor 2a2 in one magnetic domain of the second pitch signal track 12. The angle data $\theta 1$ and $\theta 2$ are merged into an absolute position data Dout by operation of the data producing means 5.

Figure 2:
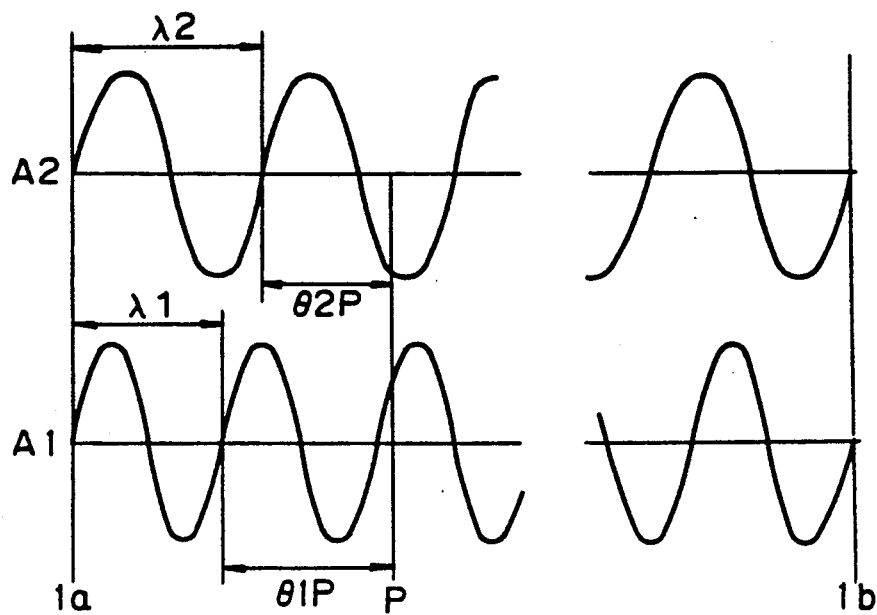
FIG. 2 is a graph showing wave shapes of detection signals processed in the encoder shown in FIG. 1.

Next, the process of conversion carried out by the data producing means 5 will be explained in more detail primarily by reference to FIG. 2. The wave shapes in the phases A1 and A2 are shown in this Figure over a period in which the positions of detection by the first and second magnetic sensors 2a1 and 2a2 have moved from the starting point 1a to the end point 1b on the first and second pitch signal tracks 11 and 12. Here, the number of repetition N1 of the sine wave of the A1 phase detection signal per one rotation of the magnetic recording medium and the number of repetition N2 of the sine wave of the A2 phase detection signal have no common prime factors. Accordingly, as the positions of detection advance from the starting point 1a to the end point 1b, the phase difference between the A1 and A2 phase detection signals increases gradually and resumes the initial relationship at the starting point 1a when the positions of detection arrive at the end point 1b. That is, a unique phase relationship between the A1 and A2 phase detection signals appears at each point in the period of travel from the starting point 1a to the end point 1b.

More specifically, it is assumed that an angle data $\theta 1p$ is produced by the angle calculator 31c on the basis of an A1 phase detection signal issued at a sensor position P and an angle data $\theta 2p$ is produced by the angle calculator 32c on the basis of an A2 phase detection signal issued at the same time. It will be appreciated that, during the period of travel from the starting point 1a to the end point 1b, the angle data $\theta 1p$ is obtained at N1 sensor positions and the angle data $\theta 2p$ is obtained at N2 sensor positions. However, only one sensor position P can provide the angle data $\theta 1p$ and $\theta 2p$ concurrently during the period of travel from the starting point 1a to the terminal point 1b. In other words, once the angle data $\theta 1$ and $\theta 2$ are specified, a corresponding sensor position at each point in the area between the starting and terminal positions 1a, 1b is uniquely fixed.

In the arrangement shown in FIG. 1, the absolute position data converting table stores the angle data $\theta 1$ in the track 11 and the angle data $\theta 2$ in the track 12 for each absolute position data at every position between the starting and end positions 1a and 1b of the tracks. As a consequence, by designating an angle data $\theta 1$ for the first track 11 and an angle data $\theta 2$ for the second track 12, the data producing means 5 issues an absolute position data Dout which indicates the position of the sensors with respect to the starting position 1a.

In the case of the illustrated embodiment, the angle data $\theta 1$ and $\theta 2$ from the first and second angle calculators 31c and 32c are converted into the absolute position data Dout. As an alternative expedient, it is also possible to directly convert the digital data Da1 and Da2 from the A/D converters 31a and 32a into the absolute position data Dout.

The operation of the absolute encoder in accordance with the second embodiment of the present invention will now be explained in reference to FIG. 3. This embodiment is advantageously employed in particular when no high degree of resolution is required for calculating the absolute position data and a high degree of resolution is required for calculation of the incremental position data. The absolute encoder in this case is provided with two sets of pitch signal tracks such as used in the first embodiment and one set of incremental signal track which ensures production of pitch signals of high resolution.

Figure 3:
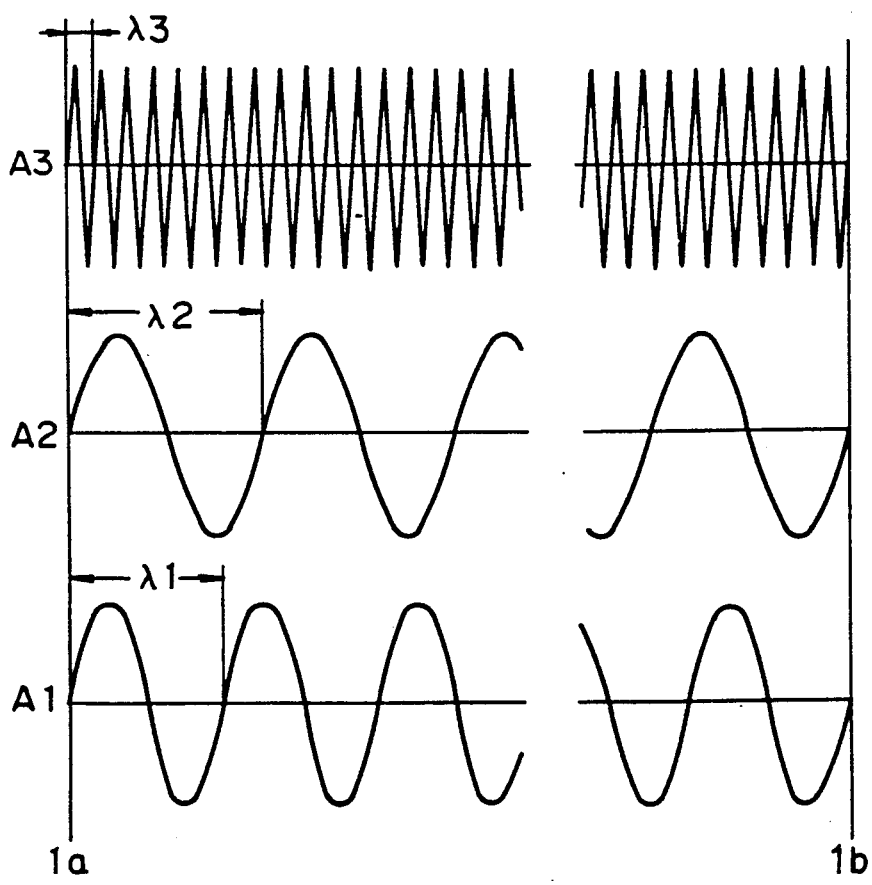
FIG. 3 is a graph showing wave shapes of detection signals processed in the second embodiment of the encoder in accordance with the present invention.

An A1 phase detection signal and an A2 phase detection signal produced by the pitch signal tracks are shown in FIG. 3. An A3 phase detection signal produced by the incremental signal track 50 is also shown in FIG. 3. As the sensor position shifts from the starting to the terminal position 1a, 1b of the tracks, the A1 phase detection signal includes N1 repetitions of a sine wave of wave length $\lambda 1$, the A2 phase detection signal includes N2 repetitions of a sine wave of wave length $\lambda 2$ and the A3 phase detection signal includes N3 repetition of a sine wave of wave length $\lambda 3$. Like the first embodiment, the numbers of repetition N1 and N2 have no common prime factors. In a same manner same as that in the first embodiment, an absolute position data Dout is produced form the A1 phase and A2 phase detection signals. The presence of the A3 phase detection signal results in production of an incremental position data with a high degree of resolution.

In accordance with the above-described features of the present invention, a high degree of resolution can be obtained with no significant increase in number of tracks thanks to the use of a pair of pitch signal tracks characterized by the absence of common prime factors between the numbers of repetition of pitch signals stored in the individual pitch signal tracks.

We claim:
1. An absolute encoder comprising:
   at least a first and a second signal track, said first and second signal tracks having associated therewith, respectively, a first and second periodic signal, each of said first and second periodic signals having a respective repetition number assoiciated therewith and the repetition number of said first periodic signal having no common factor with the repetition number of said second periodic signal;
   a first and a second group of sensors, each group including at least two respective sensors, each group of sensors arranged facing a respective one of said signal tracks for detecting said periodic signal thereof,
   at least two respective A/D converters connected to each said sensor group for outputting signal level data corresponding to said periodic signal; and
   an absolute position data producing means connected to said A/D converters for producing, on the basis of said signal level data, an absolute position data indicative of the absolute position of said sensors relative to a starting position of said signal tracks.

2. An absolute encoder as claimed in claim 1 in which said signal tracks are pitch signal tracks.

3. An absolute encoder, comprising:

at least a first and a second pitch signal track, said first and second signal tracks having associated therewith, respectively, a first and second periodic signal, each of said first and second periodic signals having a respective repetition number associated therewith and the repetition number of said first periodic signal having no common factor with the repetition number of said second periodic signal;

a first and a second group of sensors, each group including at least two respective sensors, each group of sensors arranged facing a respective one of said signal tracks for detecting said periodic signal thereof, at least two respective A/D converters connected to each said sensor group for outputting for signal level data corresponding to said periodic signal;

an absolute position data producing means connected to said A/D converters for producing, on the basis of said signal level data, an absolute position data indicative of the absolute position of said sensors relative to a starting position of said signal tracks; and an incremental signal track.

4. An absolute encoder as claimed in any of claims 1 to 3 in which said absolute position data producing means is connected to each said A/D converter via an angle calculator which issues an angle data on the basis of said signal level data.

5. An absolute encoder as claimed in one of claims 1 to 3 in which said signals are magnetically stored in a said signal tracks and said sensors are magnetic sensors.

* * * * *